United States Patent [19]

Pruitt

[11] Patent Number: 5,518,684

[45] Date of Patent: May 21, 1996

[54] METHOD OF MAKING A MOLDED LEAD FRAME

[75] Inventor: David A. Pruitt, San Jose, Calif.

[73] Assignee: National Semiconductor Corporation, Santa Clara, Calif.

[21] Appl. No.: 439,115

[22] Filed: May 10, 1995

Related U.S. Application Data

[63] Continuation of Ser. No. 209,446, Mar. 9, 1994, abandoned.

[51] Int. Cl.$^6$ .................................. B22F 5/00; B22F 3/02
[52] U.S. Cl. .................................. 419/66; 419/61
[58] Field of Search .................................. 419/61, 66

[56] References Cited

U.S. PATENT DOCUMENTS

| 5,250,130 | 10/1993 | Enloe et al. | 156/89 |
| 5,310,520 | 5/1994 | Jha et al. | 419/48 |

FOREIGN PATENT DOCUMENTS

| 86-724 | 2/1983 | European Pat. Off. . |
| 52-19971 | 2/1977 | Japan . |
| 53-39067 | 4/1978 | Japan . |
| 53-82168 | 7/1978 | Japan . |
| 53-124068 | 10/1978 | Japan . |
| 56-122154 | 9/1981 | Japan . |
| 58-31565 | 2/1983 | Japan . |
| 58-056449 | 4/1983 | Japan . |
| 58-56359 | 4/1983 | Japan . |
| 59-169161 | 9/1984 | Japan . |
| 60-138944 | 7/1985 | Japan . |
| 61-53752 | 3/1986 | Japan . |
| 61-80842 | 4/1986 | Japan . |
| 61-149449 | 7/1986 | Japan . |
| 63-064351 | 3/1988 | Japan . |
| 2-20047 | 1/1990 | Japan . |

*Primary Examiner*—Charles T. Jordan
*Assistant Examiner*—Daniel Jenkins
*Attorney, Agent, or Firm*—Hickman Beyer & Weaver

[57] ABSTRACT

A lead frame for use in an integrated circuit package is herein disclosed wherein the lead frame is produced by molding an electrically conductive material into a desired lead frame shape. There is also disclosed several possible arrangements for a lead frame produced using the molding method including, protrusions on the lead frame adapted to provide a mechanical connection to the integrated circuit package, a heat sink molded as an integral part of the lead frame with heat dissipating characteristics specific to the application in which the lead frame will be used, and an arrangement which provides a heat conducting portion adapted to thermally connect a component attached to the lead frame to an external heat sink.

7 Claims, 3 Drawing Sheets

METHOD OF MAKING A MOLDED LEAD FRAME

CROSS REFERENCE TO RELATED APPLICATION

This application is a continuation of U.S. patent application Ser. No. 08/209,446 entitled A MOLDED LEAD FRAME AND METHOD OF MAKING SAME filed Mar. 9, 1994 (now abandoned).

BACKGROUND OF THE INVENTION

The present invention relates generally to a lead frame for use in an integrated circuit package and more specifically to a method of producing a lead frame by molding an electrically conductive material such as powdered copper metal into a desired lead frame shape.

The process of molding a powdered metal currently exists and is used to produce a wide variety of items. To date this technique has been considered a process which is used in situations that require an exotic alloy or some other specialized application. However, the applicant has determined that this technique can be applied to produce cost effective and improved lead frames.

Lead frames for use in an integrated circuit package are typically produced in one of two ways, either being stamped or etched from a sheet of rolled copper. Although this process is widely used and is commercially successful, there are some inherent disadvantages and limitations when using lead frames manufactured by this process.

One of the disadvantages of the current method of producing lead frames results from the process of rolling the copper sheet that is used as the raw material. When metal is rolled it tends to develop a grain in the direction that the material is rolled. After the material has been stamped or etched into the desired lead frame shape, the typical process of manufacturing an integrated circuit package involves wire bonding various components to the lead frame. However, the grain of the lead frame material can have a negative effect on the bonding characteristics of the wire bonding process, depending on the direction of the grain relative to the direction of the bonding process. This problem becomes more significant as the pitch or density of the leads on the lead frame increases. As will be seen hereinafter, lead frames produced in accordance with the present invention do not have the above mentioned grain and therefore do not produce the above mentioned bonding problem.

Another disadvantage with the current method of stamping or etching lead frames is the amount of material wasted. Both of these processes involve removing material from a copper sheet to produce the desired shape. All of the cut away or etched material must be scrapped. Again, as will be seen hereinafter, the present invention significantly reduces the amount of material wasted during the production of a lead frame by using only the appropriate amount of powdered material to mold the desired shape.

FIGS. 1 and 2 illustrate an example of an integrated circuit package, generally designated by reference numeral 10, supporting a lead frame 12 produced using the current method of stamping or etching the lead frame from a sheet of copper. Lead frame 12 includes an array of leads 14 and one or more component attach pads indicated by 18 and 20. Still referring to FIGS. 1 and 2, another problem encountered with stamped or etched lead frames is providing a means for mechanically attaching the lead frame to the integrated circuit package. Typically this is accomplished by stamping or etching a small locking hole 16 in each of the leads 14. When the integrated circuit package is molded around lead frame 12, the molding material fills locking hole 16 forming a small pin through hole 16. This pin mechanically attaches the lead to the package.

However, in fine pitch applications where the width of lead 14 gets smaller as the lead density increases, the locking hole method of attaching the lead to the package becomes less practical. When the width of the lead is reduced, the diameter of the locking hole must be reduced. As the diameter of the locking hole approaches the thickness of the lead, it becomes difficult to stamp or etch a locking hole because of the physical limitations of the stamping and etching processes. The present invention eliminates the need for a locking hole and provides an improved method of mechanically connecting the lead to the package, especially in a fine pitch application.

Another limitation associated with a stamped or etched lead frame is again associated with fine pitch applications where the density of the leads causes the width of the leads to approach the same dimension as the thickness of the leads. Both the etching process and the stamping process have certain lead spacing limitations under these circumstances. The present invention eliminates these limitations and allows lead frames to be produced wherein the lead thickness can be greater than the lead width in cases where this is desired.

Another significant disadvantage of the current method of producing lead frames is that the lead frame is limited to one thickness. Because lead frames are typically stamped or etched from a single sheet of material, designers are limited in what can be designed into the lead frame. For instance, still referring to FIGS. 1 and 2, a designer may wish to use component attach pad 18 as a heat sink. In this situation, the designer would be restricted to a heat sink with a thickness equal to the thickness of the component attach pad which, in some cases, may not provide a large enough heat Sink. To compensate for this restriction, a discrete heat sink might be added to the lead frame during the manufacture of the integrated circuit package. Alternatively, a heat conducting portion or path 22 of lead frame 12 might be added to a component attach pad 20 to allow the lead frame based component attach pad 20 to be connected to an external heat sink. However, having the thickness of the heat conducting path 22 limited to the thickness of the lead frame and a desire to avoid the need for a discrete or external heat sink prevents these approaches from solving the problem in all instances. A lead frame produced in accordance with the present invention allows a lead frame to be produced wherein the thickness of the lead frame can be varied to create a heat sink or a heat conducting path that suits the requirements of the application.

SUMMARY OF THE INVENTION

As will be described in more detail herein, a lead frame for use in an integrated circuit package is disclosed wherein the lead frame is produced by molding an electrically conductive material into a desired lead frame shape. There are also disclosed several possible arrangements for a lead frame produced using this method of molding a lead frame.

One arrangement includes protrusions on the leads of the lead frame adapted to provide a mechanical connection between the leads and the integrated circuit package when the package is molded around the lead frame.

A second arrangement includes a heat sink molded as an integral part of a the lead frame, with heat dissipating characteristics specific to the application in which the lead frame will be used.

A third arrangement provides a heat conducting portion or path molded as an integral part of the lead frame and adapted to thermally connect a component attached to a component attach pad of the lead frame to an external heat sink.

Still other arrangements are contemplated by the present invention which would not be possible or at least not practical using conventional stamping and etching techniques but which are practical using the molding technique disclosed herein.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Figure 1:
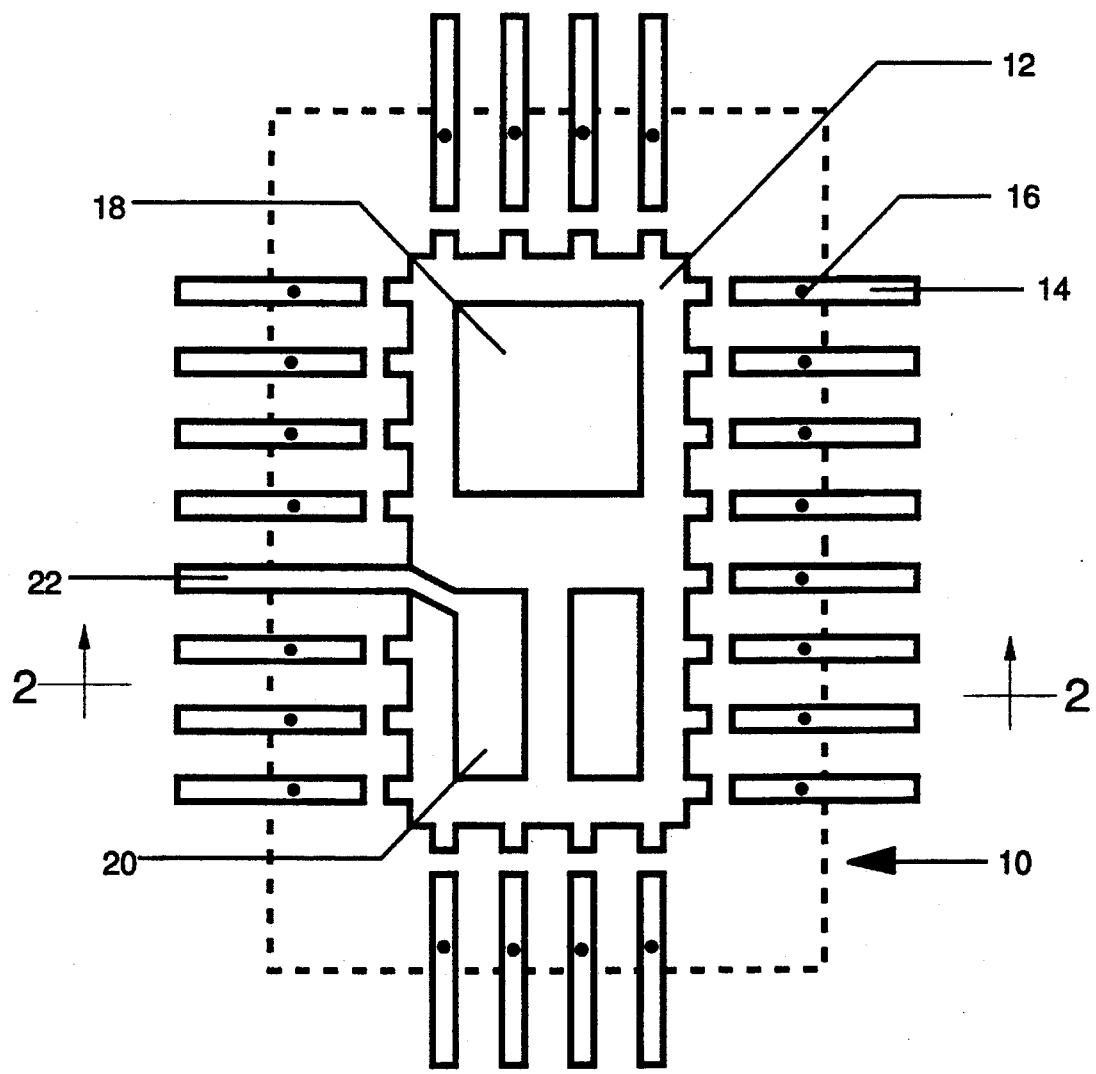
FIG. 1 is a diagrammatic plan view of a prior art integrated circuit package including a lead frame.
Figure 2:
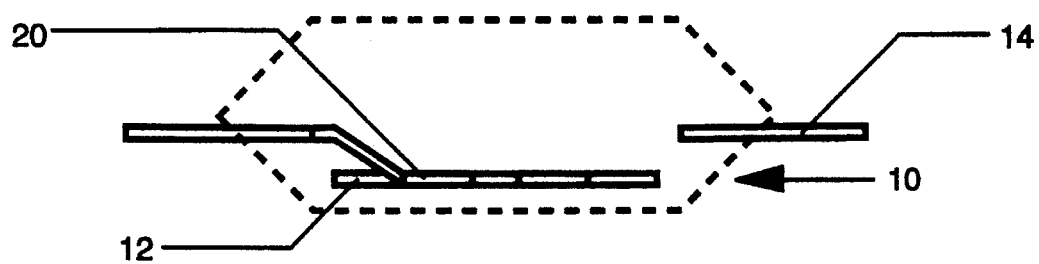
FIG. 2 is a diagrammatic cross-sectional view of the prior art integrated circuit package illustrated in FIG. 1.

Inasmuch as FIGS. 1 and 2 were discussed previously, attention is directed to FIGS. 3 and 4 which illustrate an integrated circuit package 30 including a lead frame 32 in accordance with one of the preferred embodiments of the present invention including several possible features. Lead frame 32 is produced by molding an electrically conductive material, such as powdered copper, into a desired shape. Although powdered copper is mentioned as a preferred material for molding a lead frame in accordance with the present invention, it should be understood that any electrically conductive material that can be molded may be used, such as but not limited to, high strength electrically conductive alloys or electrically conductive ceramics.

As was mentioned above, the technology for molding a powdered metal currently exist and therefore Will not be further described. The present invention relates to applying this technique to the production of a lead frame for use in an integrated circuit package.

Three of the advantages of the present invention are a direct result of the molding process itself. First, as was mentioned above, the molding process does not create a grain in the material of the lead frame, as does the current method of rolling the sheet copper used to produce a lead frame. Therefore the present invention avoids the bonding difficulty that the grain causes during the bonding process which electrically connects the components of the integrated circuit package to the leads. Second and again as was mentioned above, the molding process eliminates the material waste associated with the current method of producing a lead frame. Only the amount of material needed to produce the lead frame is used. Third, and most important, the molding process allows the lead frame to be easily formed into most any desired shape including segments of variable thickness.

Figure 3:
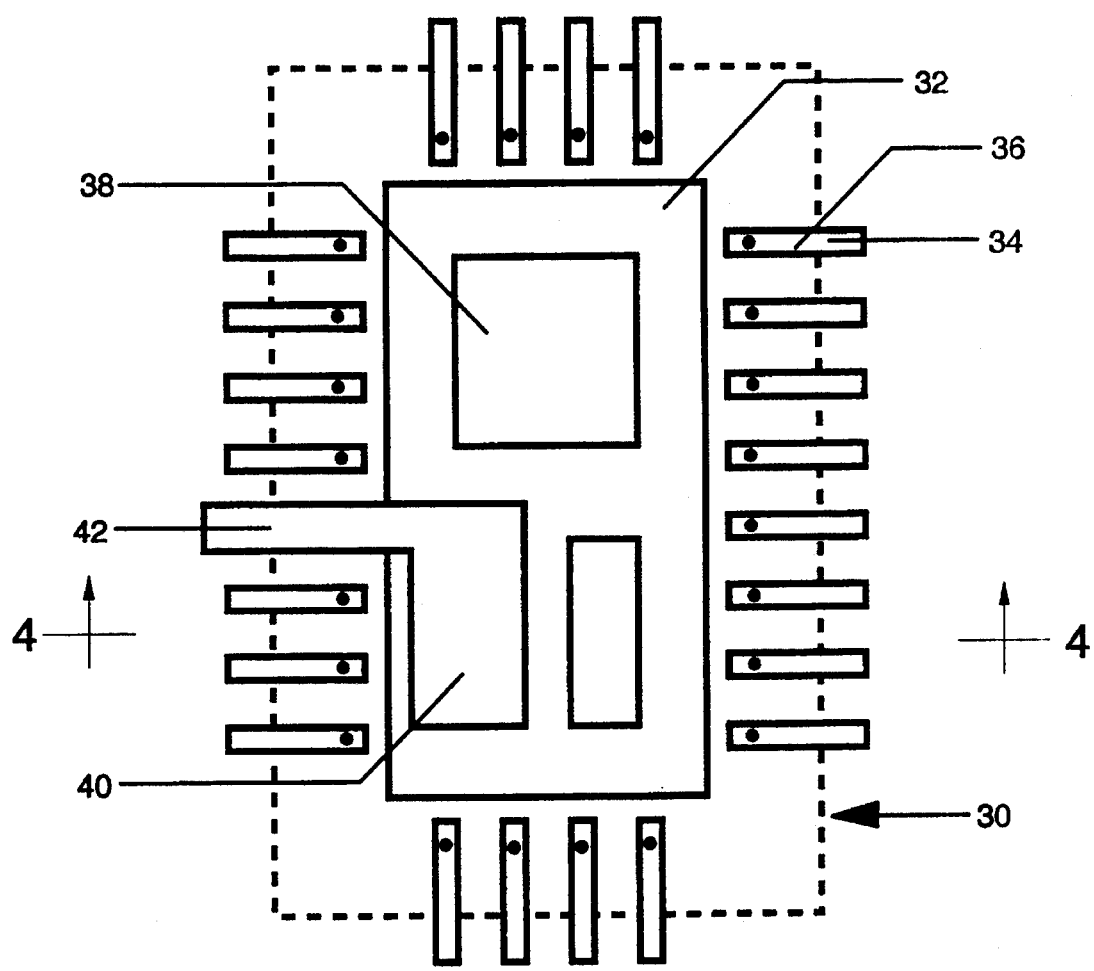
FIG. 3 is a diagrammatic plan view of a integrated circuit package including a lead frame produced in accordance with the present invention wherein various portions of the lead frame have different thickness, also shown are several features which may be included in a lead frame produced in accordance with the present invention.
Figure 4:
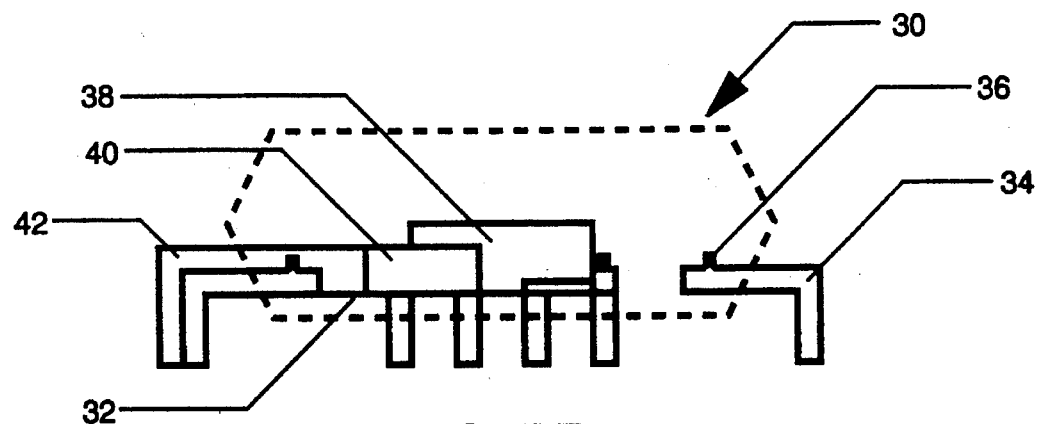
FIG. 4 is a diagrammatic cross-sectional view of the integrated circuit package illustrated in FIG. 3.

Referring to FIGS. 3 and 4, one of the features that may be included on lead frame 32 and produced in accordance with the present invention is a protrusion 36 on each of the leads indicated at 34. These protrusions act as hooks or anchors mechanically attaching the lead to integrated circuit package 30 after the package has been molded around lead frame 32. This improved method of mechanically attaching each of the leads to integrated circuit package 30 becomes more significant as the pitch or density of the leads increases. Because the protrusions are formed as an integral part of the lead frame they do not weaken the lead as does the prior art method of stamping or etching a hole in the lead. Also, the width of the lead is not limited by the hole size since no hole is required by the present method. Therefore, lead frames produced according to the present invention are capable of finer pitch or increased lead density as compared to prior art methods of producing lead frames.

Another advantage of the present invention is that the leads can take on a wide variety of shapes and thicknesses and are not limited to flat leads with a given thickness as in the prior art methods of producing lead frames. As shown in FIGS. 3 and 4, the leads, as exemplified by lead 34, can be molded into their final shape rather than being bent into their final shape as in the prior art method. Because of this, leads with a thickness substantially greater than their width may be formed which allows for a finer pitch while maintaining a given lead cross-sectional area by increasing the thickness rather than the width of the lead.

Figure 5:
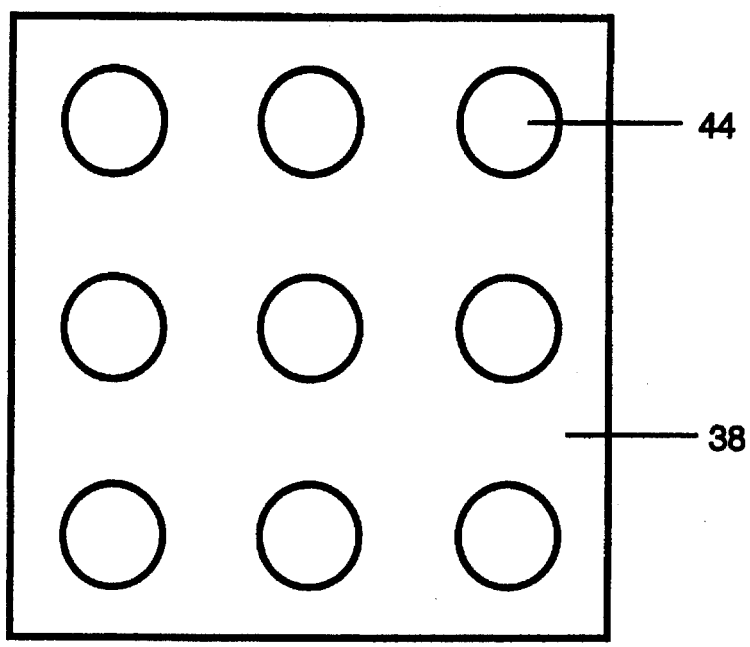
FIG. 5 is a diagrammatic bottom view of one possible embodiment of a heat sink which is part of a lead frame produced in accordance with the present invention.
Figure 6:
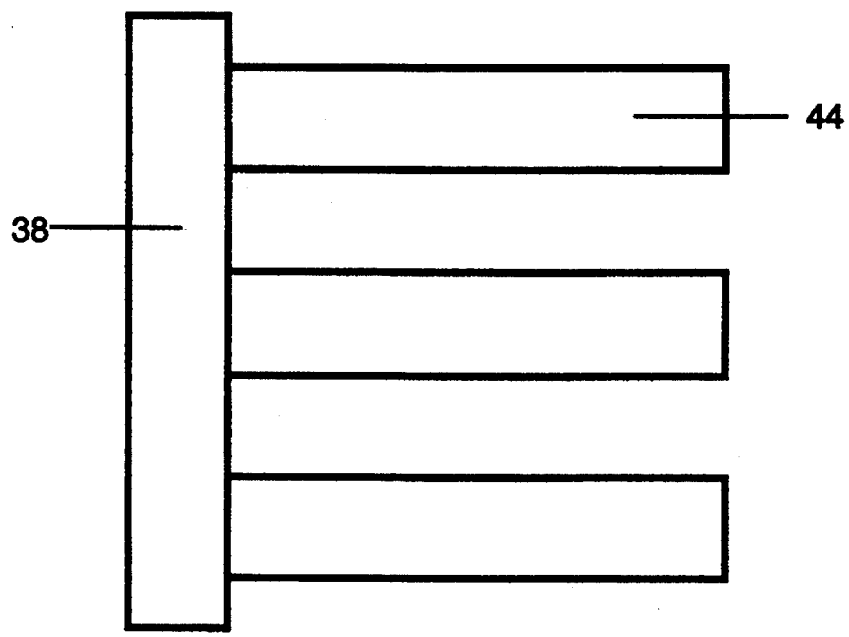
FIG. 6 is a diagrammatic side view of the heat sink illustrated in FIG. 5.

The molding process allows various portions of lead frame 32 to have different thicknesses and shapes providing much more flexibility in the design of a lead frame. For instance, still referring to FIGS. 3 and 4, lead frame 32 includes one or more component attach pads indicated by 38 and 40. In this particular embodiment, Component attach pad 38 incorporates a heat sink with characteristics specific to the component that will be attached. This heat sink may take on a wide variety of shapes and thicknesses depending on the design requirements. FIGS. 5 and 6 illustrate one possible arrangement for heat sink 38 which includes a plurality of protrusions 44. These protrusions increase the surface area of heat sink 38 therefore increasing the heat sinks heat dissipating capability. It should be understood that the molding process allows for a wide variety of heat sink shapes and the present invention is not limited to the example given.

Although the above described method of providing a heat sink specific to the requirements of the component to be attached to the lead frame offers a much wider array of design possibilities for a lead frame, there may still be situations where heat sink requirements are to large to be handled by a heat sink internal to the integrated circuit package. In these situations an external heat sink is required.

As was described above, the prior art method of producing lead frames allows for providing a heat conducting path which allows the component attach pad to be thermally connected to an external heat sink. However, limitations on the thickness of the heat conducting path prevents this approach from solving the problem in all instances. Referring back to FIGS. 3 and 4, lead frame 32 includes a heat conducting path 42 connected to component attach pad 40. The present invention allows component attach pad 40 and heat conducting path 42 to be produced much thicker than prior art methods allow, providing increased heat dissipating capabilities. This offers a broader range of heat sink solutions and increases the design flexibility for lead frames.

The method of producing a lead frame by molding an electrically conductive material into a desired shape has been described in association with FIGS. 3–6. It should be understood that this method is not limited to such applications but may be used in any case where it is desirable to vary the thickness of any given portion of a lead frame. Indeed, it may be desirable to provide a lead frame based structure with a varied thickness for purposes other than the above described features. The present invention would apply to such a structure generally.

What is claimed is:

1. A method of manufacturing a lead frame for use in, for example, an integrated circuit package, said method comprising the steps of;

(a) providing a mold which defines a desired, three dimensional lead frame shape having varying dimensions in all three dimensions, (b) providing electrically conductive lead frame material to be molded into said lead frame shape, and (c) using said mold, molding said electrically conductive lead frame material into said lead frame having said desired lead frame shape.

2. A method according to claim 1 wherein said electrically conductive material is a powdered copper metal.

3. A method according to claim 1 wherein said lead frame material is molded into a lead frame including a plurality of protrusions integrally formed as part of said lead frame which extend outward from said lead frame forming at least a portion of said desired three dimensional lead frame shape having varying dimensions in all three dimensions, said protrusions being adapted to provide a mechanical connection to said integrated circuit package.

4. A method according to claim 3 wherein said lead frame material is molded into a lead frame including an array of electrically conductive leads each of which includes a respective one of said protrusions adapted to provide a mechanical connection to said integrated circuit package.

5. A method according to claim 1 wherein said lead frame material is molded into a lead frame including a component attach pad adapted to allow a component to be attached to said lead frame during the manufacture of said integrated circuit package, wherein said component attach pad includes a heat sink, said heat sink displaying a thickness which is greater than said component attach pad so as to provide sufficient thermal mass for the intended application of said lead frame.

6. A method according to claim 5 wherein said heat sink includes a plurality of protrusions integrally formed as part of said lead frame which extend outward from said lead frame forming at least a portion of said desired three dimensional lead frame shape having varying dimensions in all three dimensions, said protrusions increasing the heat dissipation characteristics of said heat sink.

7. A method according to claim 1 wherein said lead frame is molded to include;

(a) a component attach pad adapted to allow a component to be attached to said lead frame during the manufacture of said integrated circuit package, and (b) a heat conducting portion, wherein said heat conducting portion is connected to said component attach pad and extends to the outer perimeter of said lead frame and said heat conducting portion is adapted to provide a means for thermally connecting said component to an external heat sink.

* * * * *